(12) United States Patent
Hafizi

(10) Patent No.: US 10,963,002 B1
(45) Date of Patent: Mar. 30, 2021

(54) CLOCK GENERATION ARCHITECTURE USING A POLY-PHASE FILTER WITH SELF-CORRECTION CAPABILITY

(71) Applicant: QUALCOMM Incorporated, San Diego, CA (US)

(72) Inventor: Madjid Hafizi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/890,820

(22) Filed: Jun. 2, 2020

(51) Int. Cl.
| | | |
|---|---|---|
| G06F 1/10 | (2006.01) | |
| H03F 3/45 | (2006.01) | |
| H04B 1/40 | (2015.01) | |

(52) U.S. Cl.
CPC ........... *G06F 1/10* (2013.01); *H03F 3/45475* (2013.01); *H04B 1/40* (2013.01)

(58) Field of Classification Search
None
See application file for complete search history.

(56) References Cited

U.S. PATENT DOCUMENTS 7,656,984 B2 * 2/2010 Kim ...................... H03L 7/0812
375/373
8,324,949 B2 * 12/2012 Cherkassky ......... H03K 5/1565
327/175

\* cited by examiner

*Primary Examiner* — Jeffery S Zweizig
(74) *Attorney, Agent, or Firm* — Seyfarth Shaw LLP; Chui-kiu Teresa Wong

(57) ABSTRACT

An in-phase/quadrature (I/Q) clock generator is described. The I/Q clock generated includes a poly-phase filter configured to generate a four-phase quadrature clock signal in response to a two-phase quadrature clock signal generated in response to a single-ended input clock signal. The I/Q clock generated also includes a phase interpolator configured to generate an output four-phase quadrature clock signal from the four-phase quadrature clock signal. The I/Q clock generated further includes a poly-phase filter tune circuit coupled to an output of the phase interpolator. The poly-phase filter tune circuit is configured to generate a control voltage for the poly-phase filter to tune the four-phase quadrature clock signal from the poly-phase filter.

20 Claims, 8 Drawing Sheets

US 10,963,002 B1

CLOCK GENERATION ARCHITECTURE USING A POLY-PHASE FILTER WITH SELF-CORRECTION CAPABILITY

BACKGROUND

Field

The present disclosure relates generally to clock generation and, more specifically, to a clock generation architecture using a poly-phase filter with self-correction capability.

Background

Electronic devices, such as computers, smartphones, mobile devices, Internet-of-Things (IoT) devices, and other like mobile platform devices are continually driving the demand for faster data. Conventional communications links used in mobile platform devices may be unable to handle and facilitate the voluminous data consumed by such mobile platform devices. One option for meeting this ever expanding volume of data is using a high-speed serial interface to implement chip-to-chip communications. For example, a wireless device (e.g., a cellular phone or a smartphone) in a wireless communications system may transmit and receive data for two-way communications using a radio frequency integrated circuit (RFIC) chip. The RFIC chip may communicate with a modem chip of the wireless device using a chip-to-chip serializer/deserializer (SERDES) link.

Unfortunately, clocking specifications for conventional chip-to-chip SERDES links are insufficient for supporting communications enhancements, such as fifth generation (5G) communications, as well as future sixth generation (6G) communications. A clocking scheme to enable chip-to-chip SERDES links that support 5G/6G communications is desired.

SUMMARY

An in-phase/quadrature (I/Q) clock generator is described. The I/Q clock generated includes a poly-phase filter configured to generate a four-phase quadrature clock signal in response to a two-phase quadrature clock signal generated in response to a single-ended input clock signal. The I/Q clock generated also includes a phase interpolator configured to generate an output four-phase quadrature clock signal from the four-phase quadrature clock signal. The I/Q clock generated further includes a poly-phase filter tune circuit coupled to an output of the phase interpolator. The poly-phase filter tune circuit is configured to generate a control voltage for the poly-phase filter to tune the four-phase quadrature clock signal from the poly-phase filter.

A method for generating a four-phase quadrature clock signal is described. The method includes generating a quadrature clock signal in response to a single-ended input clock signal. The method also includes generating, by a poly-phase filter (PPF), an analog version of the four-phase quadrature clock signal from the quadrature clock signal in response to a control voltage from a PPF tune circuit in a feedback loop. The method further includes generating, by a phase interpolator, a digital output four-phase quadrature clock signal from an amplified four-phase in-phase/quadrature (I/Q) clock. The method includes feeding back the digital output four-phase quadrature clock signal to the PPF tune circuit.

An in-phase/quadrature (I/Q) clock generator is described. The I/Q clock generated includes a poly-phase filter configured to generate a four-phase quadrature clock signal in response to a two-phase quadrature clock signal generated in response to a single-ended input clock signal. The I/Q clock generated also includes a phase interpolator configured to generate an output four-phase quadrature clock signal from the four-phase quadrature clock signal. The I/Q clock generated further includes means for generating a control voltage for the poly-phase filter to tune the four-phase quadrature clock signal from the poly-phase filter.

Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1:
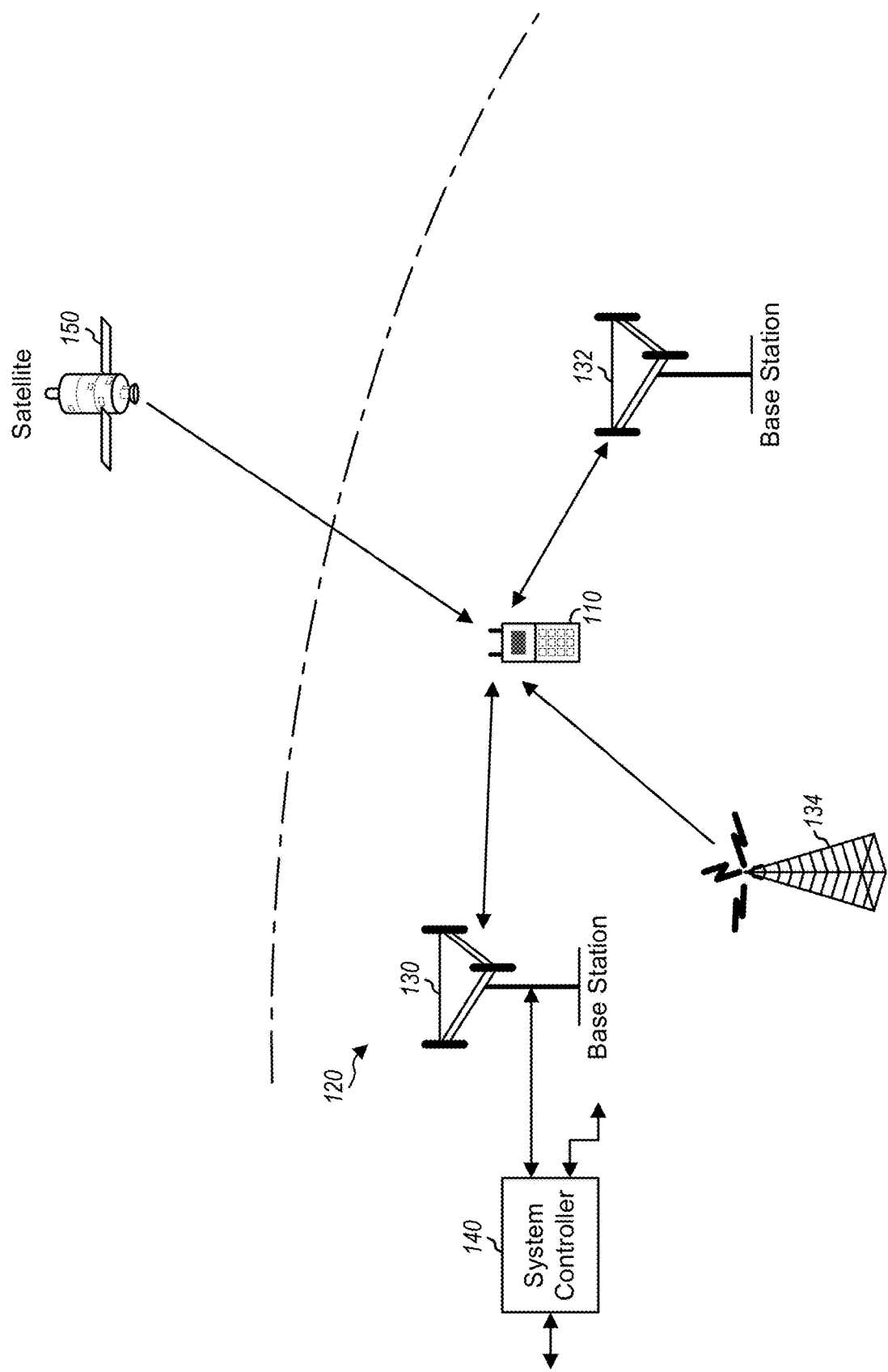
FIG. 1 shows a wireless device communicating with a wireless system.

The detailed description set forth below, in connection with the appended drawings, is intended as a description of various configurations and is not intended to represent the only configurations in which the concepts described may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

Based on the teachings, one skilled in the art should appreciate that the scope of the disclosure is intended to cover any aspect of the disclosure, whether implemented independently of or combined with any other aspect of the disclosure. For example, an apparatus may be implemented or a method may be practiced using any number of the aspects set forth. The apparatus may, for example, be one of a computing system (e.g., servers, datacenters, desktop computers), a mobile computing device (e.g., laptops, cell phones, vehicles, etc.), Internet of Things device, and a virtual reality or an augmented reality system. In addition, the scope of the disclosure is intended to cover such an apparatus or method practiced using other structure, functionality, or structure and functionality, in addition to or other than the various aspects of the disclosure set forth. It should be understood that any aspect of the disclosure disclosed may be embodied by one or more elements of a claim.

As described, the use of the term "and/or" is intended to represent an "inclusive OR," and the use of the term "or" is intended to represent an "exclusive OR." As described, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described, the term "proximate" used throughout this description means "adjacent, very near, next to, or close to." As described, the term "on," used throughout this description, means "directly on" in some configurations, and "indirectly on" in other configurations. As described, the term "low impedance," used throughout this description, means "low voltage swings, large current." As described, the term "high impedance," used throughout this description, means "high voltage swings, small current."

Although particular aspects are described, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different technologies, system configurations, networks and protocols, some of which are illustrated by way of example in the figures and in the following description of the preferred aspects. The detailed description and drawings are merely illustrative of the disclosure, rather than limiting the scope of the disclosure being defined by the appended claims and equivalents thereof.

Electronic devices, such as computers, smartphones, mobile devices, Internet-of-Things (IoT) devices, and other like mobile platform devices are continually driving the demand for faster data. Conventional communications links used in mobile platform devices may be unable to handle and facilitate the voluminous data consumed by such mobile platform devices. One option for meeting this ever expanding volume of data is using a high-speed serial interface to implement chip-to-chip communications. For example, a wireless device (e.g., a cellular phone or a smartphone) in a wireless communications system may transmit and receive data for two-way communications using a radio frequency integrated circuit (RFIC) chip. The RFIC chip may communicate with a modem chip of the wireless device using a chip-to-chip serializer/deserializer (SERDES) link.

Unfortunately, clocking specifications for conventional chip-to-chip SERDES links are insufficient to support communications enhancements, such as fifth generation (5G) communications, as well as future sixth generation (6G) communications. Phase interpolators are widely used clocking specifications for SERDES receivers. A phase interpolator may rotate an in-phase (I) and quadrature (Q) clock phase in N number of steps to properly align an in-phase clock with the center of a data eye. Aligning the in-phase clock with the center of the data eye improves the sampling opportunity of a SERDES receiver. In operation, the in-phase clock and quadrature clock are 90 degrees (90°) apart in phase.

Phase rotation by the interpolator may be performed by a clock and data recovery (CDR) loop. In operation, the clock and data recovery loop forces the quadrature clock to coincide with a data crossing edge. Aligning the quadrature clock with the data cross edge places the in-phase clock (which is 90° apart), at the center of the data bit (the preferred position to sample the data). Optimum sampling by the SERDES receiver, therefore, depends on the in-phase to quadrature (I/Q) phase accuracy. I/Q phase accuracy is based on making the separation between the in-phase clock and the quadrature clock as close to 90° as possible.

In-phase and quadrature clock phase generation for phase interpolators is important in low power applications, such as a chip-to-chip SERDES link for support communications enhancements (e.g., 5G/6G communications). A chip-to-chip SERDES link specifies a phase interpolator configured to generate accurate phases (e.g., 90° apart), while maintaining low power consumption. This phase interpolator may operate with four clock phases (e.g., 0°, 90°, 180°, and 270° apart). The phase interpolator may mix these clock phases to rotate the clock phase in a number of phase steps (N). The phase interpolator is configured to maintain the clock phases 90° apart and to provide a desired clock duty-cycle over all N phase steps. To meet this specification, an initial four-phase quadrature clock is desired that is nearly perfect in both duty-cycle and quadrature phase error, which is defined as an in-phase-quadrature phase.

In-phase and quadrature clock phase generation by the phase interpolator should operate with low power consumption. One contributing factor to power consumption of the in-phase and quadrature clock phase generation, is the power consumed in distribution of the clock from a source to a destination phase interpolator. In a chip-to-chip SERDES link, a clock distribution distance is significant because multiple instances of the phase interpolator form multiple data lanes to meet the very high data throughput between, for example, a radio frequency integrated circuit (RFIC) and a modem chip (e.g., a 5G mobile standard modem).

Unfortunately, the high data throughput specification of the chip-to-chip SERDES link dictates a complex data transmission and receive path. In particular, the chip-to-chip SERDES link is configured with multiple data transmit and receive paths, each running at a high data rate, with each path transmitting and receiving data at the same time. In addition, each receiving data lane includes a dedicated phase interpolator, and the four-phase clock is distributed to the phase interpolator at a high frequency. This clock distribution scheme, however, involves significant and costly power consumption.

Aspects of the present disclosure are directed to a clock generation architecture for a chip-to-chip SERDES link, configured to generate nearly perfect quadrature clock phases with low power consumption using a single input clock phase. According to this aspect of the present disclosure, a single clock phase is distributed to all data lanes of the chip-to-chip SERDES link, which beneficially reduces the clock distribution power consumption by a factor of four. At the point of use, the single-phase clock is converted to differential phases (e.g., 0° and 180°). Unfortunately, a duty-cycle of this single-phase clock scheme is impaired because of both the long distances traveled and the conversion from a single-ended to a differential signal. According to this aspect of the present disclosure, the clock generation architecture includes a duty-cycle correction stage, configured to sample the final clock output duty-cycle and correct the duty-cycle at the point of use.

FIG. 1 shows a wireless device 110, including a clock generation architecture using a poly-phase filter with self-correction capability to support enhanced communications with a wireless communications system 120. The wireless device 110 includes a multi-band (e.g., dual-band) concurrent millimeter wave (mmW) transceiver. The wireless communications system 120 may be a 5G NR system, a long term evolution (LTE) system, a code division multiple access (CDMA) system, a global system for mobile communications (GSM) system, a wireless local area network (WLAN) system, millimeter wave (mmW) technology, or some other wireless system. A CDMA system may implement wideband CDMA (WCDMA), time division synchronous CDMA (TD-SCDMA), CDMA2000, or some other version of CDMA. In a millimeter wave (mmW) system, multiple antennas are used for beamforming (e.g., in the range of 30 GHz, 60 GHz, etc.). For simplicity, FIG. 1 shows the wireless communications system 120, including two base stations 130 and 132 and one system controller 140. In general, a wireless system may include any number of base stations and any number of network entities.

The wireless device 110 may be referred to as a mobile equipment, a user equipment (UE), a mobile station, a terminal, an access terminal, a subscriber unit, a station, etc. The wireless device 110 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth® device, etc. The wireless device 110 may be capable of communicating with the wireless communications system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communications such as 5G NR, LTE, CDMA2000, WCDMA, TD-SCDMA, GSM, 802.11, etc.

Figure 2:
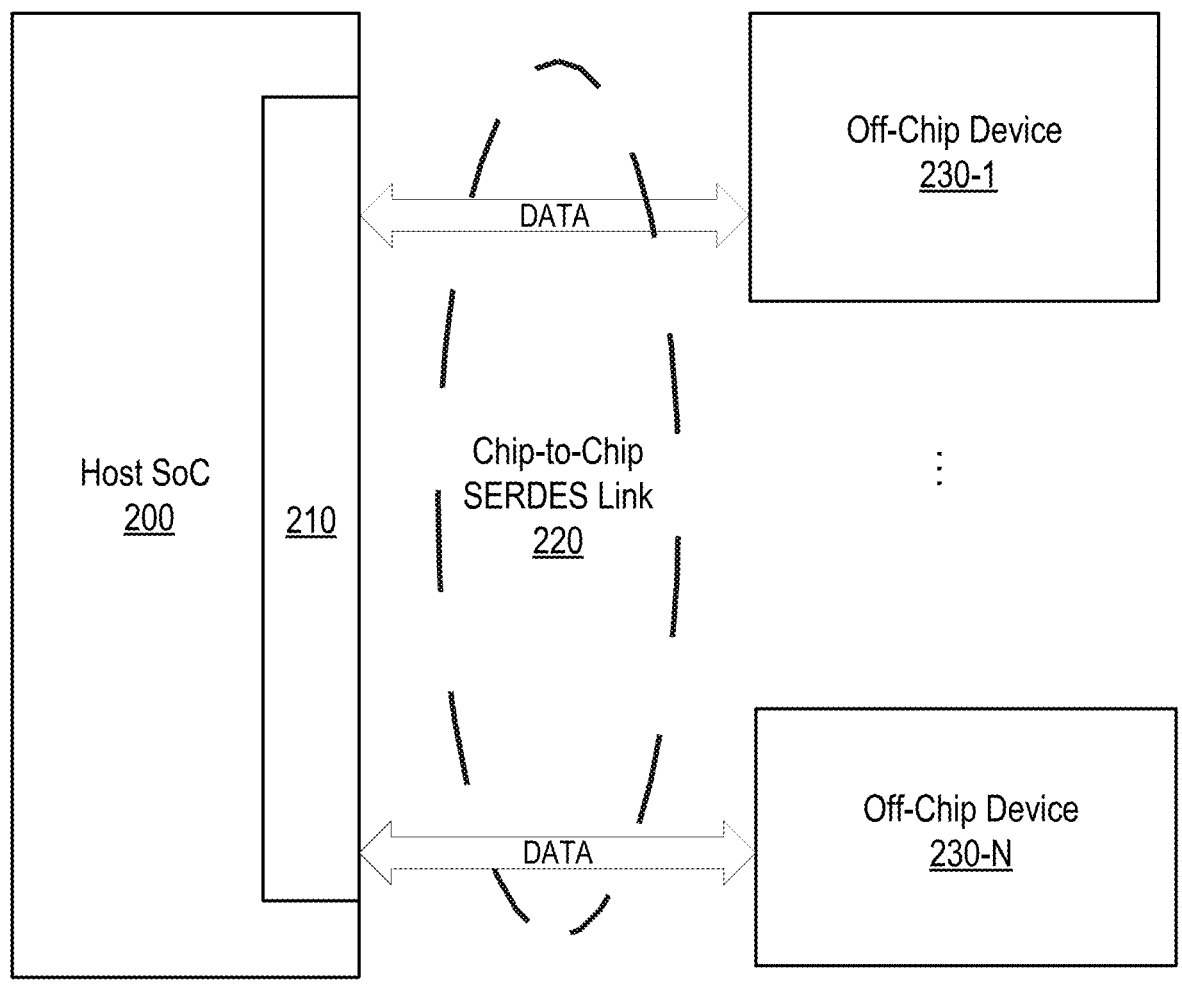
FIG. 2 is an example implementation illustrating a host system-on-chip (SoC) of the wireless device of FIG. 1 communicably coupled to off-chip devices over a chip-to-chip serial link, in accordance with aspects of the present disclosure.

FIG. 2 is an example implementation illustrating a host system-on-chip (SoC) 220 of the wireless device 110 of FIG. 1 communicably coupled to off-chip devices over a chip-to-chip serial link, in accordance with aspects of the present disclosure. The host SoC 200 may include processing blocks tailored to specific functions, such as a connectivity block, which may include fifth generation (5G) connectivity, fourth generation long term evolution (4G LTE) connectivity, Wi-Fi connectivity, USB connectivity, Bluetooth® connectivity, and the like. In addition, the host SoC 200 may include various processing units that support multi-threaded operation.

In this configuration, the host SoC 200 includes a chip-to-chip interface 210, configured to communicate with off-chip devices 230 (230-1, . . . , 230-N) over, for example, a chip-to-chip serializer/deserializer (SERDES) link 220. According to aspects of the present disclosure, the chip-to-chip SERDES link 220 supports multiple data lanes to meet the very high data throughput between, for example, a radio frequency integrated circuit (RFIC) chip and a modem chip (e.g. a 5G mobile standard modem). In this example, the RFIC chip and/or the modem chip may be one of the off-chip devices 230. The RFIC chip may communicate with a modem chip using the chip-to-chip SERDES link 220. A clock generation architecture for enabling the chip-to-chip SERDES link 220 to support communications enhancements, such as 5G new radio (NR) communications, is shown in FIG. 3.

Figure 3:
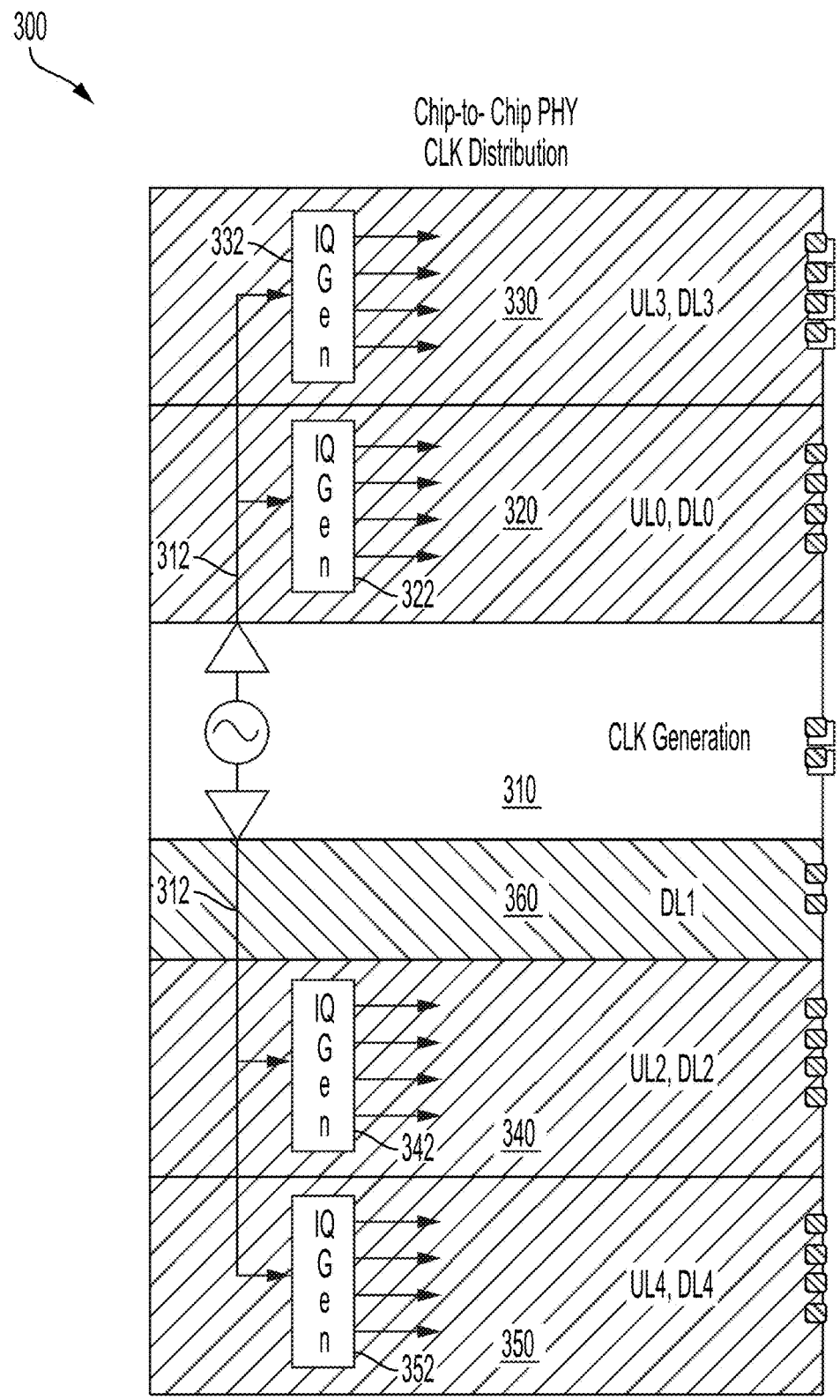
FIG. 3 is a block diagram illustrating a clock generation architecture of the host system-on-chip (SoC) of FIG. 2, in accordance with aspects of the present disclosure.

FIG. 3 is a block diagram illustrating a clock distribution architecture of the host SoC 200 of FIG. 2, in accordance with aspects of the present disclosure. This aspect of the present disclosure is directed to a clock distribution architecture 300 for the chip-to-chip SERDES link 220 of FIG. 2. The clock distribution architecture 300 is configured to generate extremely accurate quadrature clock phases with low power consumption using a single clock phase 312.

In one configuration, a clock generator 310 generates the single clock phase 312 that is distributed to each of the data lanes of the chip-to-chip SERDES link. In this configuration, the single clock phase 312 is distributed to first data lanes 320 (e.g., uplink/downlink UL0, DL0), second data lanes 330 (e.g., uplink/downlink UL3, DL3), third data lanes 340 (e.g., uplink/downlink UL2, DL2), and fourth data lanes 350 (e.g., uplink/downlink UL4, DL4) of the chip-to-chip SERDES link. The clock distribution architecture 300 also includes a receiver 360 (e.g., DL1). Distributing the single clock phase 312 to each of the data lanes (320, 330, 340, and 350) of the chip-to-chip SERDES link (e.g., 220) beneficially reduces power consumption of the clock distribution architecture 300 by a factor of four.

In this aspect of the present disclosure, each of the data lanes (320, 330, 340, and 350) includes an in-phase (I) and quadrature (Q) clock generator (e.g., I/Q clock generator 322, I/Q clock generator 332, I/Q clock generator 342, and I/Q clock generator 352). In this example, the single clock phase 312 is initially converted into differential phases (e.g., 0° and 180°) at the point of use. Unfortunately, a duty-cycle of this single-phase clock scheme is impaired due to significant distances traveled and the conversion of the single clock phase 312 to a differential signal. The I/Q clock generators (e.g., 322, 332, 342, and 352) may include a duty-cycle correction stage configured to correct the duty-cycle at the point of use, as further illustrated in FIG. 4.

Figure 4:
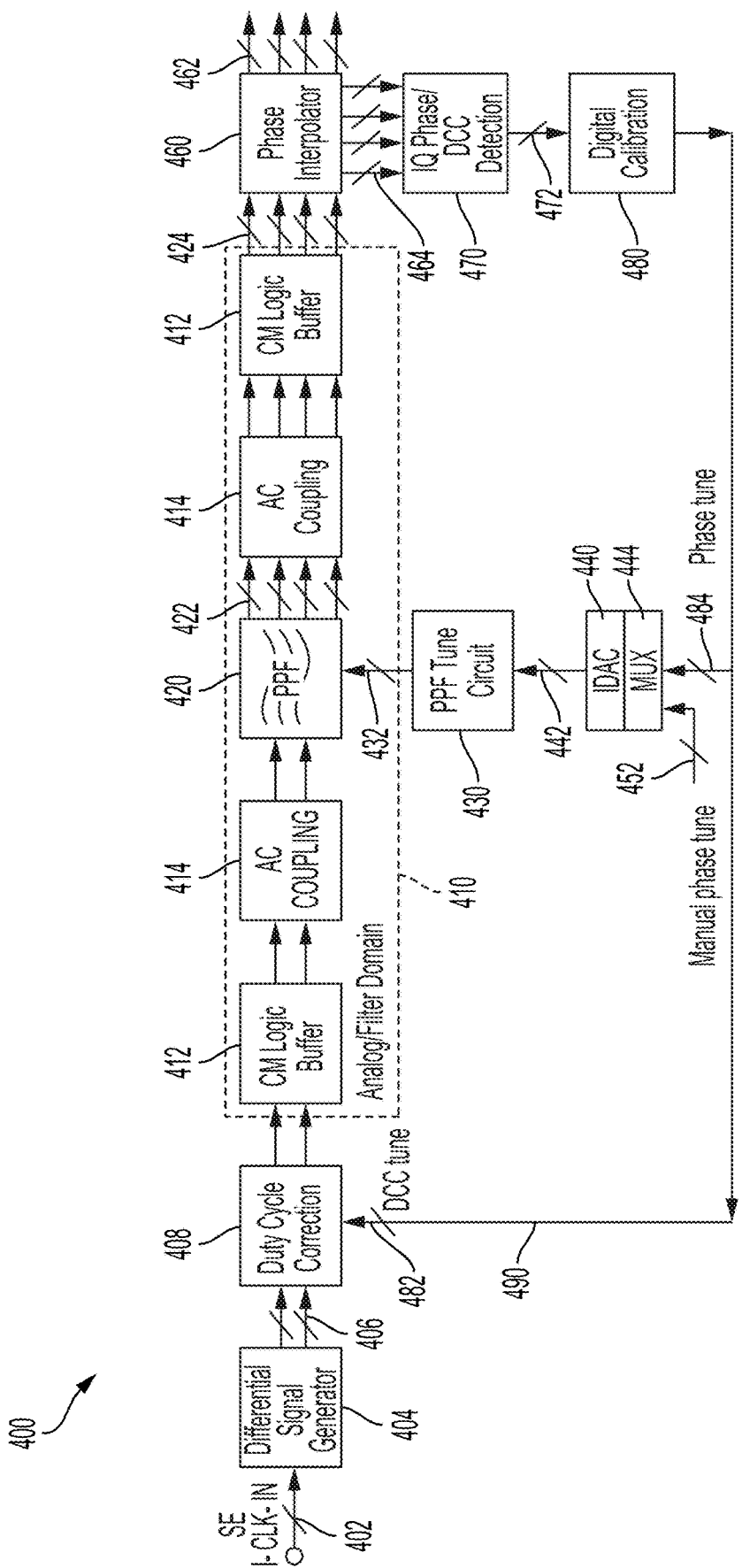
FIG. 4 is a block diagram illustrating an in-phase/quadrature (I/Q) clock generator of the clock distribution architecture of FIG. 3, in accordance with aspects of the present disclosure.

FIG. 4 is a block diagram illustrating an in-phase/quadrature (I/Q) clock generator of the clock distribution architecture 300 of FIG. 3, in accordance with aspects of the present disclosure. In one configuration, an I/Q clock generator 400 includes a differential signal generator 404, configured to convert a single-ended input clock signal 402 (e.g., the single clock phase 312 of FIG. 3) into a differential input clock signal 406 (e.g. a two-phase quadrature clock signal). In this configuration, the single-ended input clock signal 402 is received at a complementary metal oxide semiconductor (CMOS) digital logic level (e.g., a full-swing between a logic "0" and a logic "1" voltage level), prior to conversion into the differential input clock signal 406.

As noted, the duty-cycle of the differential input clock signal 406 is likely impaired due to a significant distance propagated through the clock distribution architecture 300 of FIG. 3 and the conversion from the single-ended input clock signal 402. In this aspect of the present disclosure, the I/Q clock generator 400 includes a duty-cycle correction stage 408 (e.g., an input duty-cycle correction stage). In one configuration, the duty-cycle correction stage 408 corrects the duty-cycle of the differential input clock signal 406 according to a duty-cycle correction (DCC) tune value 482. The DCC tune value 482 is provided as part of a feedback loop 490 (described in further detail below) to enable duty-cycle correction of the differential input clock signal 406 at the point of use prior to an analog/filter domain 410.

According to this aspect of the present disclosure, the differential input clock signal 406 is provided to a common mode (CM) logic buffer 412 (e.g., an input CM logic buffer) configured to convert the differential input clock signal 406 into an analog format (e.g., an analog quadrature clock signal). The analog format of the differential input clock signal 406 is provided to an input of alternating current (AC) coupling stages 414 to remove a direct current (DC) component of the analog format of the differential input clock signal 406. This single frequency tone signal is provided as input to a poly-phase filter 420. In this configuration, the poly-phase filter 420 generates a four-phase I/Q clock signal 422 (e.g., a four-phase quadrature clock signal) for a phase interpolator 460 to generate an output four-phase I/Q clock signal 462 (e.g., an output four-phase quadrature clock signal).

According to aspects of the present disclosure, generation of the four-phase I/Q clock signal 422 is performed by the poly-phase filter 420 in response to a poly-phase filter (PPF) tune circuit 430, which is part of the feedback loop 490. In addition to a PPF tuning scheme provided by the PPF tune circuit 430 (e.g., poly-phase filter tune circuit), the present disclosure provides a complete system solution for generation of the output four-phase I/Q clock signal 462. In particular, the poly-phase filter 420 is preceded and succeeded by the CM logic buffers 412, which provide gain stages that are AC-coupled by the input and output AC coupling stages 414 (e.g., an input AC coupling stage and an output AC coupling stage).

In aspects of the present disclosure, a current digital-to-analog converter (IDAC) 440 is a controllable current source that provides a PPF tuning current 442 to the PPF tune circuit 430 as part of the feedback loop 490. This self-correction capability provided by the feedback loop 490 also ensures biasing of the poly-phase filter 420 is well defined at the input and output of the analog/filter domain 410, as further shown in FIGS. 5A and 5B. The analog/filter domain 410 provides input and output AC coupling stages 414, as well as the gain stages provided by the input and output CM logic buffers 412 before and after the poly-phase filter 420. Without this configuration of the analog/filter domain 410, both performance of the poly-phase filter 420 and the performance of gain stages (before and after the poly-phase filter 420) would suffer due to uncertain common-mode voltage values.

The analog/filter domain 410 provides an amplified four-phase I/Q clock signal 424 from the output of the CM logic buffers 412 to the phase interpolator 460 for generation of the output four-phase I/Q clock signal 462. The phase interpolator 460 generates the output four-phase I/Q clock signal 462 at a CMOS logic level (e.g., a full-swing between a logic "0" and a logic "1" voltage level). In one configuration, the phase interpolator 460 is configured to interpolate/rotate between phases (e.g., 0°, 90°, 180°, and 270°) of the amplified four-phase I/Q clock signal 424 in thirty-two steps to generate the output four-phase I/Q clock signal 462.

According to this configuration, a rotated four-phase I/Q clock signal 464 is provided to an in-phase/quadrature (I/Q) phase/duty-cycle correction (DCC) detection stage 470 of the feedback loop. The I/Q phase/DCC detection stage 470 may be composed of a DCC error stage and an I/Q phase error detection stage. According to aspects of the present disclosure, the rotated four-phase I/Q clock signal 464 may be the same or different from the output four-phase I/Q clock signal 462. In this configuration, the I/Q phase/DCC detection stage 470 detects a phase error correction and/or a duty-cycle error correction 472 (e.g., digital DCC tune value) of the rotated four-phase I/Q clock signal 464. The phase error correction and/or the duty-cycle error correction 472 are provided to a digital calibration stage 480 configured to generate the DCC tune value 482 and a phase tune value 484.

According to this aspect of the present disclosure, the phase tune value 484 is provided to a multiplexor 444 (MUX), which also receives a manual phase tune value 452. In this configuration, the multiplexor 444 provides the phase tune value 484 (e.g., 0-31) to the current digital-to-analog converter (IDAC) 440, which provides a PPF tuning current 442 (e.g., a constant current) to the PPF tune circuit 430. The PPF tune circuit 430 is configured to generate a control voltage (VC) 432 for the poly-phase filter 420 to enable precise quadrature phase clock generation, as further shown in FIGS. 5A and 5B.

Figure 5B:
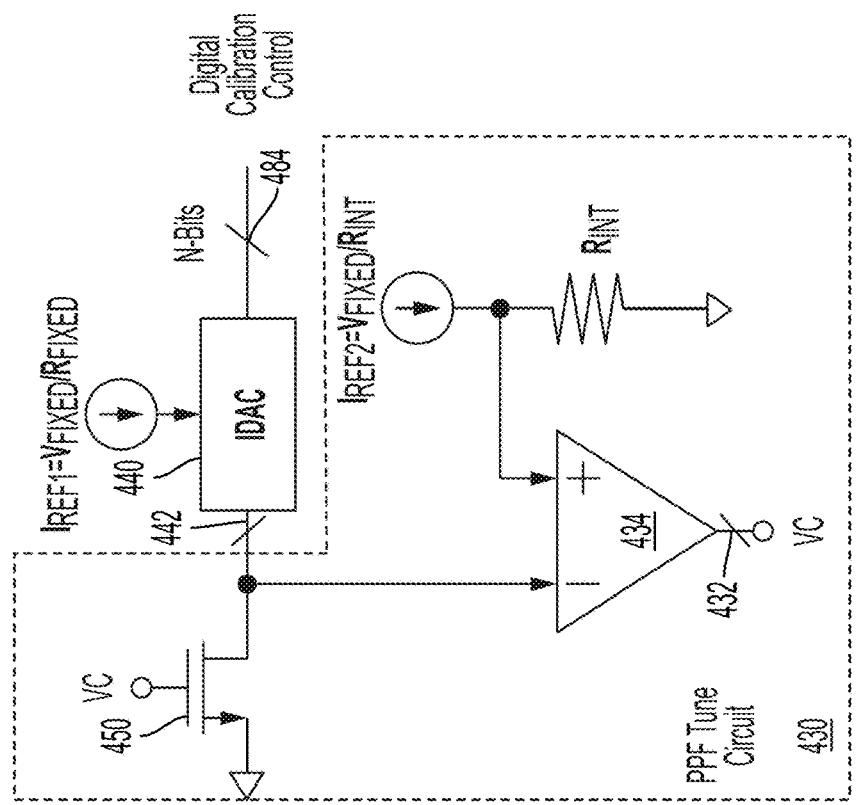
FIGS. 5A and 5B are block diagrams further illustrating a poly-phase filter (PPF) and a PPF tune circuit of the in-phase/quadrature (I/Q) clock generator of FIG. 4, in accordance with aspects of the present disclosure.
Figure 5A:
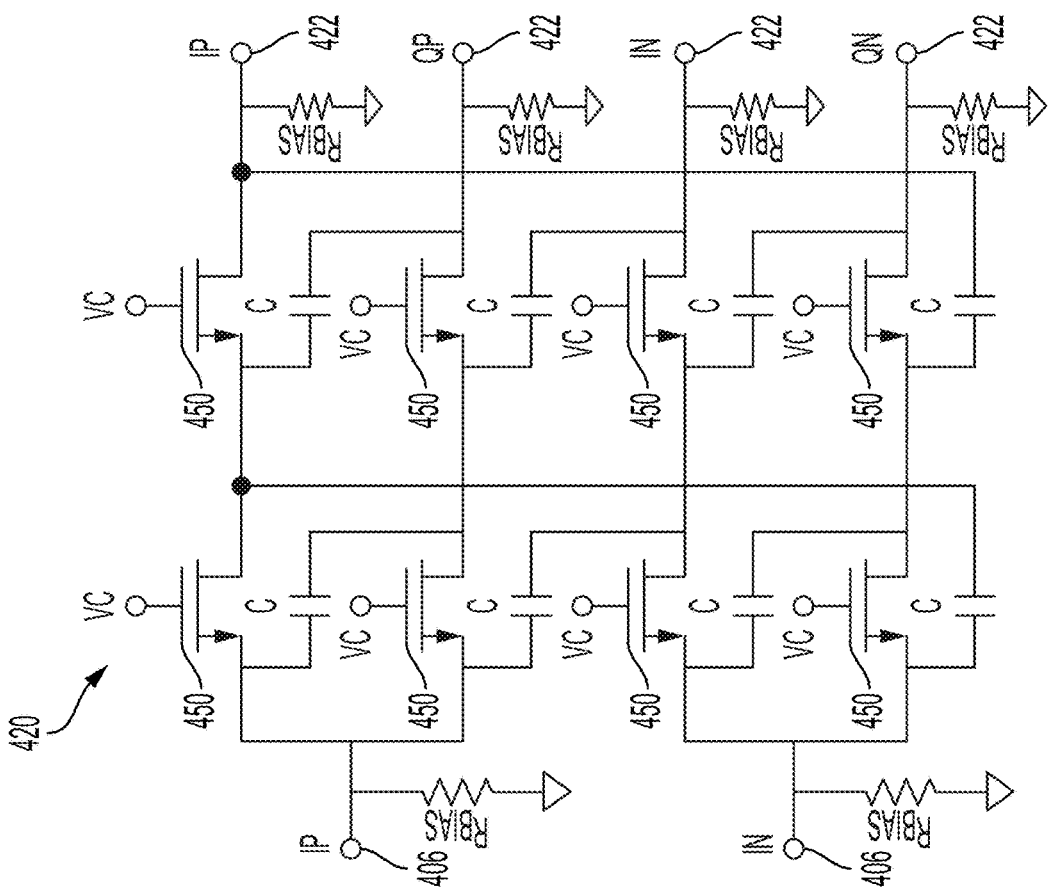

FIGS. 5A and 5B are block diagrams further illustrating the poly-phase filter 420 and the PPF tune circuit 430 of the I/Q clock generator 400 of FIG. 4, in accordance with aspects of the present disclosure.

As shown in FIG. 5A, the poly-phase filter 420 generates the four-phase I/Q clock signal 422 specified by the phase interpolator 460 at the point of use. The four-phase I/Q clock signal 422 generation is performed by the poly-phase filter 420, which is a passive circuit that draws no current. A conventional configuration of the poly-phase filter 420 may be constructed by multiple stages of resistors (R) and capacitors (C). In this configuration, a quadrature phase error of the poly-phase filter 420 is nearly zero (e.g., most desirable) at a single frequency of $1/(2*pi*R*C)$. Consequently, enabling a specified clock frequency (e.g., 9 GHz) for a chip-to-chip SERDES link (e.g., 220) involves tight control of the resistors (R) and capacitors (C) to achieve a nearly zero phase error.

Unfortunately, the resistor values may exhibit significant variation (e.g., by +/−30%). This resistor variation alone causes a quadrature phase error to exhibit significant variation (e.g., by +/−30%). Significant variation of the quadrature phase error is undesirable and causes either failure or severe impairment of the phase rotation function performed by the phase interpolator 460. According to this aspect of the present disclosure, replica transistors 450 are used in place of conventional resistors to limit variation of the quadrature phase error. That is, the replica transistors 450 are used instead of conventional resistors to construct the poly-phase filter 420. In addition, bias resistors (RmAs) are provided at input nodes (e.g., IP and IN nodes) and output nodes (e.g., IP, QP, IN, and QN). According to this configuration, a transistor gate voltage of the replica transistor 450 is varied to obtain a desired resistance value for the poly-phase filter 420. Unfortunately, the control of the gate voltage of the replica transistor 450 to obtain the desired resistance value is difficult due to process, voltage, and temperature (PVT) variations.

FIG. 5B further illustrates the PPF tune circuit 430 of the I/Q clock generator 400 of FIG. 4. According to aspects of the present disclosure, the PPF tune circuit 430 enables a closed loop system to control the gate voltage (e.g., control voltage (VC) 432) of the replica transistor 450. In one configuration, the replica transistor 450 operates as a poly-phase filter (PPF) resistor of the closed loop system. In this configuration, the current digital-to-analog converter (IDAC) 440 is a controllable current source that provides the PPF tuning current 442 to an operational amplifier 434 of the PPF tune circuit 430. The IDAC 440 receives the phase tune value 484 as an N-bit (e.g., 32 bit) digital calibration control based on a first reference current (e.g., $I_{REF1}=V_{FIXED}/R_{FIXED}$). The operational amplifier 434 receives the PPF tuning current 442 (e.g., at a first input) and a second reference current (e.g., $I_{REF2}=V_{FIXED}/R_{INT}$) as inputs (e.g., at a second input).

In this aspect of the present disclosure, the operational amplifier of the PPF tune circuit 430 is configured to generate a control voltage (VC) 432 for the poly-phase filter 420 to enable precise quadrature phase clock generation. That is, the PPF tuning current 442 (I) and the fixed voltage source (e.g., $V_{FIXED}$) are used to generate a gate voltage (e.g., control voltage VC 432) for the replica transistor 450. In this configuration, the equivalent resistance of the replica transistor 450 remains at a predetermined ratio (e.g. VC/I) over process-voltage-temperature variations. In particular, the value of the PPF tuning current 442 is automatically tuned by the IDAC 440 with an external digital calibration loop (e.g., the feedback loop 490 shown in FIG. 4). With this configuration, the final clock I/Q phase error is measured by the I/Q phase/DCC detection stage 470, then the digital calibration stage 480 uses the error measurement to control the IDAC 440 that supplies the PPF tuning current 442.

In an alternative configuration, a single current value for the PPF tuning current 442 is selected at the time of testing and fixed into a register. According to aspects of the present disclosure, the PPF tune circuit 430 and the IDAC 440 achieve stability of the predetermined ratio (e.g. VC/I) over process-voltage-temperature variations. Generating the control voltage VC 432 and PPF tuning current 442 (I) in this specific manner maintains the predetermined ratio (e.g., VC/I) constant over process-voltage-temperature variations.

In this aspect of the present disclosure, the PPF tuning current 442 enables tuning of the poly-phase filter 420 over process-voltage-temperature variations to obtain a near zero in-phase/quadrature phase error. That is, the PPF tuning current 442 enables tuning of the poly-phase filter 420 to achieve a minimal phase error. Furthermore, the value of the PPF tuning current 442 is calibrated using a digital control loop (e.g., feedback loop 490) by continuously or periodically monitoring the phase error and updating the value of the PPF tuning current 442 using the IDAC 440. Beneficially, this process of I/Q phase generation is both self-tuning and capable of calibration for ultimate precision by controlling the PPF tuning current 442.

Figure 6A:
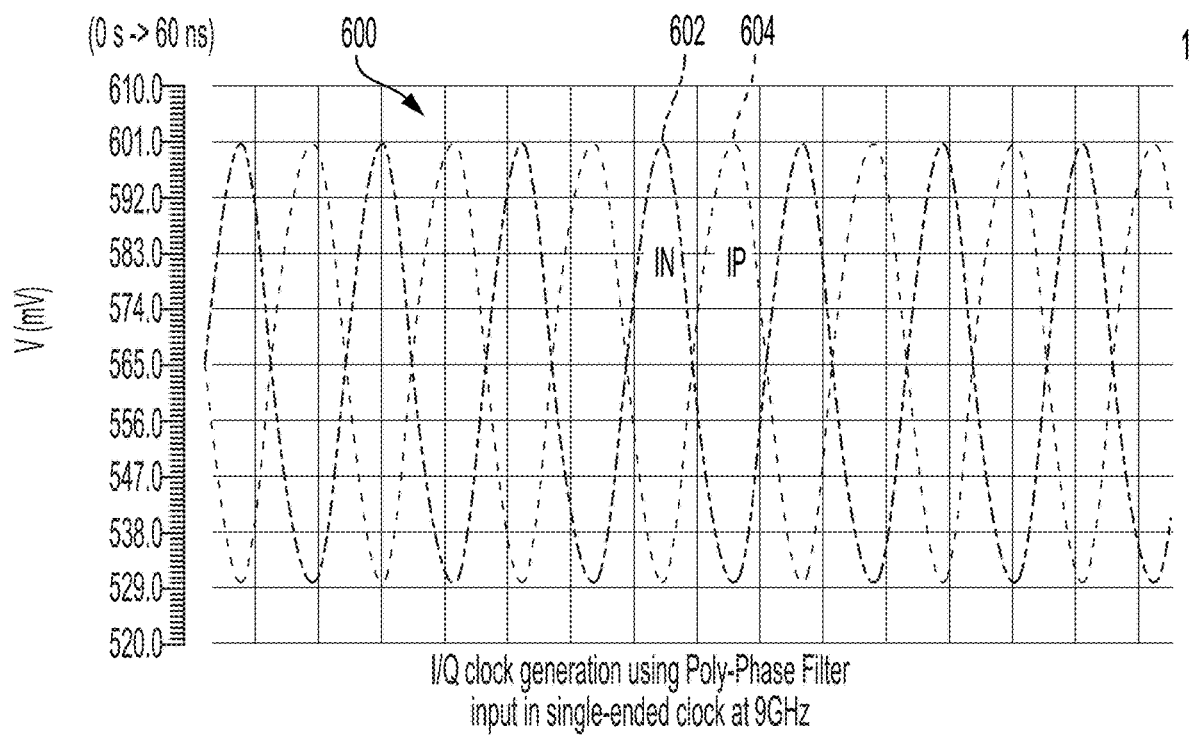
FIGS. 6A and 6B are timing diagrams, illustrating an output four-phase in-phase/quadrature (I/Q) clock signal of FIG. 4, according to aspects of the present disclosure.
Figure 6B:
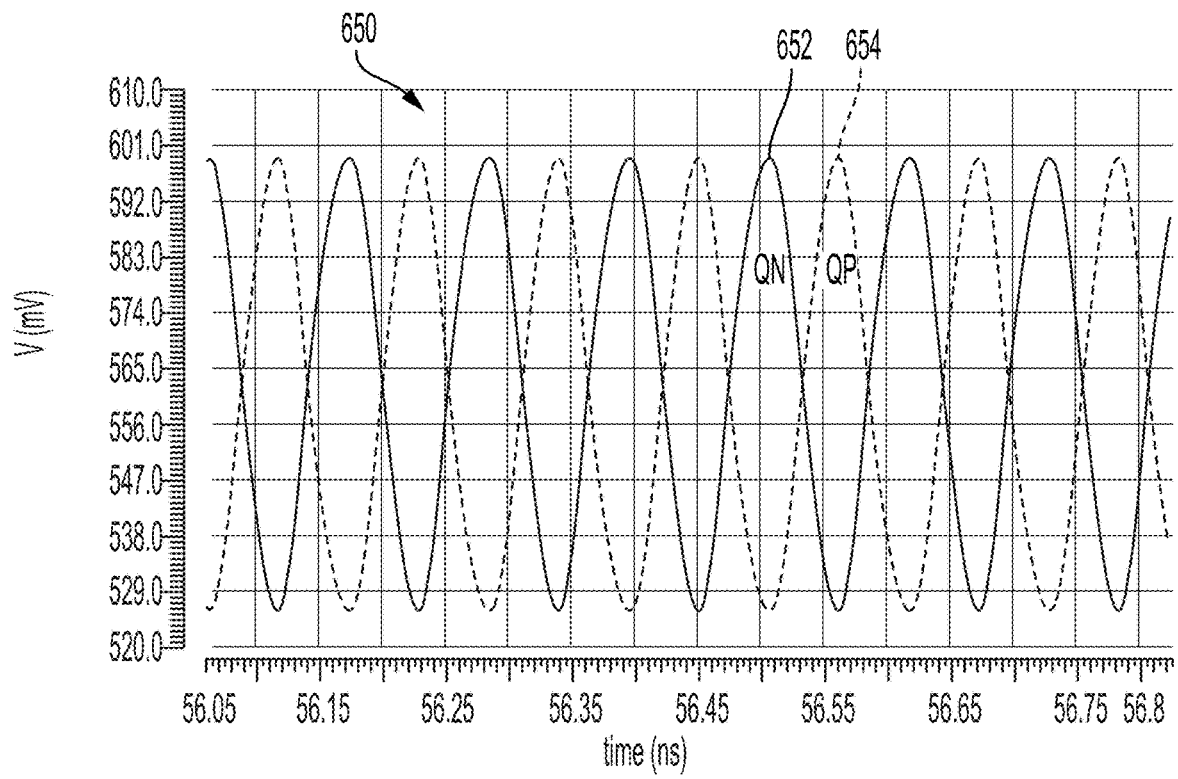

FIGS. 6A and 6B are timing diagrams, illustrating the output four-phase I/Q clock signal 462 of FIG. 4, according to aspects of the present disclosure. FIG. 6A is a timing diagram 600 illustrating a first quadrature output signal 602 (e.g., IN at 0°) and a second quadrature output signal 604 (e.g., IP at 180°). FIG. 6B is a timing diagram 650 illustrating a third quadrature output signal 652 (e.g., QN at 90°) and a fourth quadrature output signal 654 (e.g., QP at 270°) of the output four-phase I/Q clock signal 462. In this aspect of the present disclosure, the design of the poly-phase filter 420 enables precise generation of the quadrature in-phase/quadrature (I/Q) clock phases (e.g., 90° apart) shown in FIGS. 6A and 6B. In this example, an output of the I/Q clock generator 400 is the output four-phase I/Q clock signal 462 (e.g., four clock phases at 0°, 90°, 180°, and 270°), as further described in FIG. 7.

Figure 7:
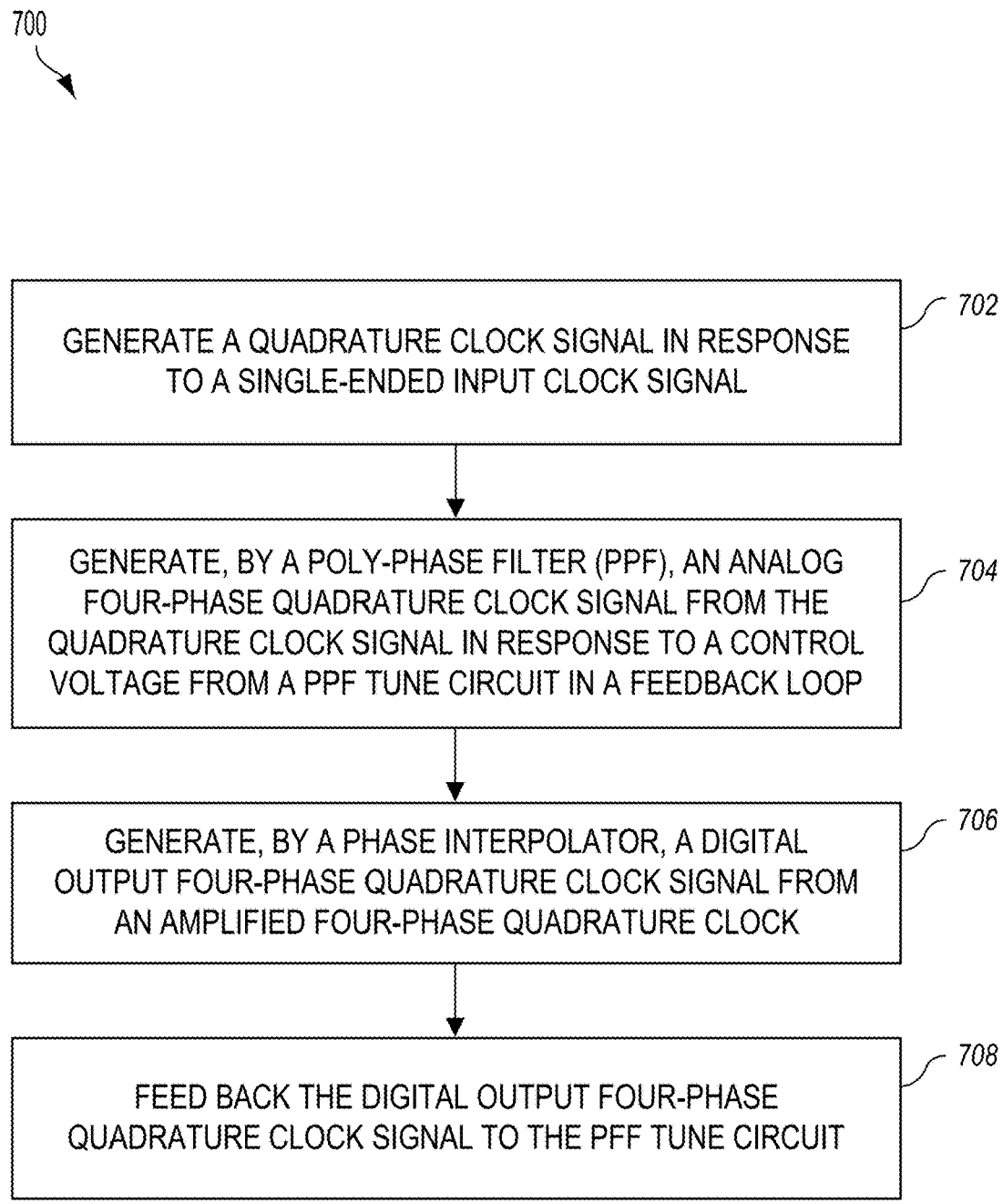
FIG. 7 is a flow diagram illustrating a method for generating a four-phase quadrature clock signal, according to aspects of the present disclosure.

FIG. 7 is a flow diagram illustrating a method for generating a four-phase quadrature clock signal, according to aspects of the present disclosure. A method 700 begins at block 702, in which a quadrature clock signal is generated in response to a single-ended input clock signal. For example, as shown in FIG. 4, the I/Q clock generator 400 includes a differential signal generator 404, configured to convert a single-ended input clock signal 402 (e.g., the single clock phase 312 of FIG. 3) into a differential input clock signal 406.

At block 704, a poly-phase filter (PPF) generates an analog four-phase quadrature clock signal from the quadrature clock signal in response to a control voltage from a PPF tune circuit in a feedback loop. For example, as shown in FIG. 4, generation of the four-phase I/Q clock signal 422 is performed by the poly-phase filter 420 in response to a poly-phase filter (PPF) tune circuit 430, which is part of the feedback loop 490. The PPF tune circuit 430 is configured to generate a control voltage (VC) 432 for the poly-phase filter 420 to enable precise quadrature phase clock generation, as shown in FIGS. 5A and 5B.

At block 706, a phase interpolator generates a digital output four-phase quadrature clock signal from an amplified four-phase quadrature clock signal. For example, as shown in FIG. 4, the poly-phase filter 420 generates a four-phase I/Q clock signal 422 for a phase interpolator 460 to generate an output four-phase I/Q clock signal 462. At block 708, the digital output four-phase quadrature clock signal is fed back to the PPF tune circuit. As shown in FIG. 4, generation of the four-phase I/Q clock signal 422 is performed by the poly-phase filter 420 in response to a poly-phase filter (PPF) tune circuit 430, which is part of the feedback loop 490. According to aspects of the present disclosure, this configuration of a PPF tuning scheme using the feedback loop 490 ensures the biasing of the poly-phase filter 420 is well defined by resistors at the input and output relative to ground, as shown in FIGS. 5A and 5B.

A next generation chip-to-chip SERDES link specifies an in-phase/quadrature clock generation at nine gigahertz (9 GHz). Meeting this clock generation frequency specification is important for both performance and power consumption. According to aspects of the present disclosure, a single-ended clock is routed to data lanes to reduce clock buffer current consumption. In addition, a differential clock is generated at the point of use, followed by duty-cycle correction to reduce an impact of cause by the single-ended clock to differential conversion as well as the significant routing. According to this aspect of the present disclosure, a quadrature phase of the I/Q clock signal is self-corrected using a replica circuit. In addition, further fine phase correction is performed by a digital calibration control according to aspects of the present disclosure.

According to aspects of the present disclosure, an I/Q clock generator is described. The I/Q clock generator may include means for means for generating a control voltage for a poly-phase filter to tune a four-phase quadrature clock signal from the poly-phase filter. The generating means may include the PPF tune circuit 430 of FIG. 4. In another aspect, the aforementioned means may be any module or any apparatus or material configured to perform the functions recited by the aforementioned means.

Figure 8:
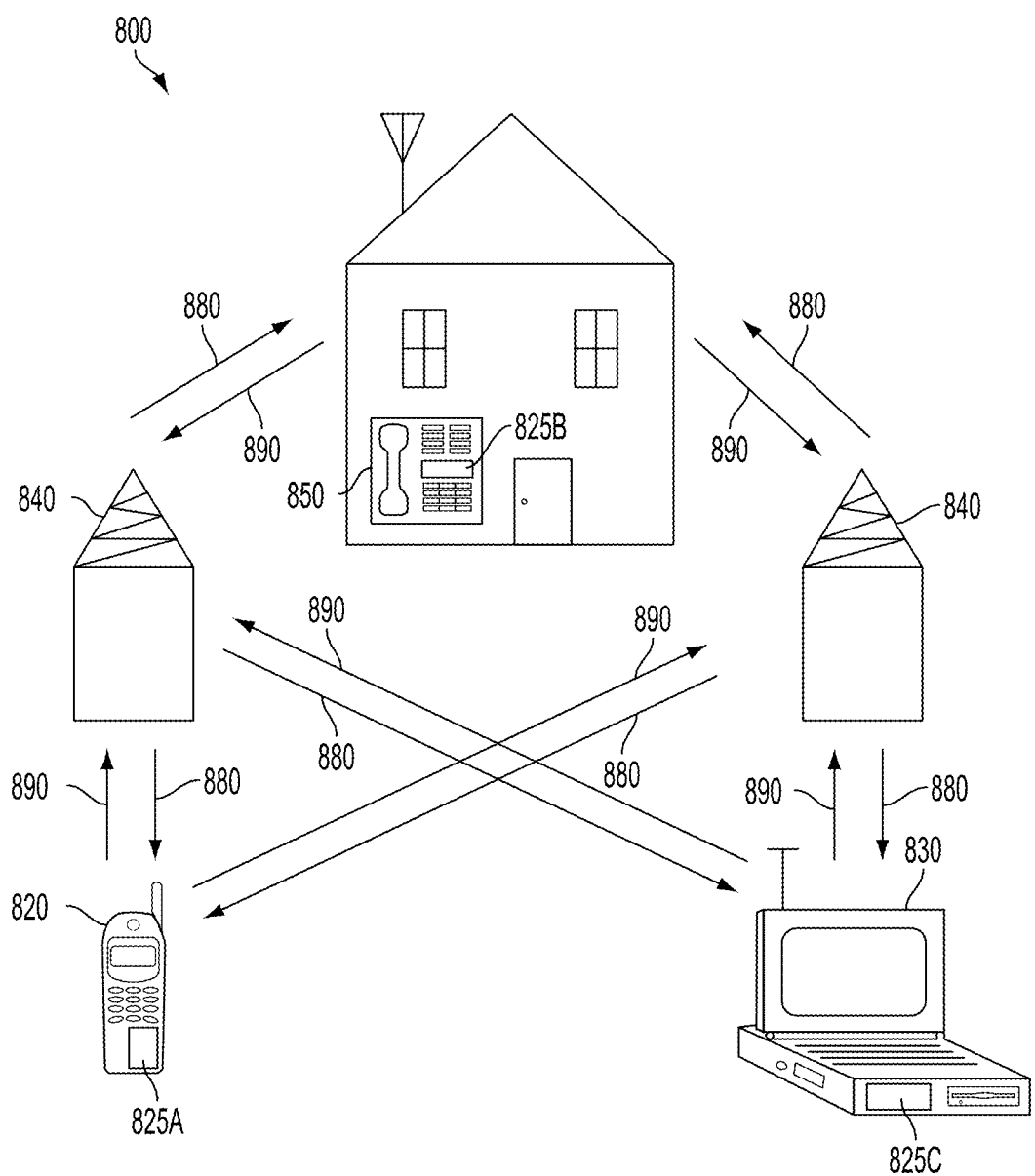
FIG. 8 is a block diagram showing an exemplary wireless communications system in which an aspect of the present disclosure may be advantageously employed.

FIG. 8 is a block diagram showing an exemplary wireless communications system 800 in which an aspect of the present disclosure may be advantageously employed. For purposes of illustration, FIG. 8 shows three remote units 820, 830, and 850 and two base stations 840. It will be recognized that wireless communications systems may have many more remote units and base stations. Remote units 820, 830, and 850 include IC devices 825A, 825B, and 825C that include the disclosed I/Q clock generator. It will be recognized that other devices may also include the disclosed I/Q clock generator, such as the base stations, user equipment, and network equipment. FIG. 8 shows forward link signals 880 from the base stations 840 to the remote units 820, 830, and 850, and reverse link signals 890 from the remote units 820, 830, and 850 to the base stations 840.

In FIG. 8, remote unit 820 is shown as a mobile telephone, remote unit 830 is shown as a portable computer, and remote unit 850 is shown as a fixed location remote unit in a wireless local loop system. For example, a remote unit may be a mobile phone, a hand-held personal communications systems (PCS) unit, a portable data unit such as a personal digital assistant (PDA), a GPS enabled device, a navigation device, a set top box, a music player, a video player, an entertainment unit, a fixed location data unit such as meter reading equipment, or other communications device that stores or retrieves data or computer instructions, or combinations thereof. Although FIG. 8 illustrates remote units according to the aspects of the present disclosure, the present disclosure is not limited to these exemplary illustrated units. Aspects of the present disclosure may be suitably employed in many devices, which include the disclosed I/Q clock generator.

The accompanying claims and their equivalents are intended to cover such forms or modifications as would fall within the scope and spirit of the protection. For example, the example apparatuses, methods, and systems disclosed may be applied to wireless devices subscribing to multiple communications networks and/or communications technologies. The apparatuses, methods, and systems disclosed may also be implemented digitally and differentially, among others. The various components illustrated in the figures may be implemented as, for example, but not limited to, software and/or firmware on a processor, ASIC/FPGA/DSP, or dedicated hardware. In addition, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed may be implemented or performed with a general purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used, include compact disc (CD), laser disc, optical disc, digital versatile disc (DVD), floppy disk, and Blu-ray® disc, where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure provides certain example aspects and applications, other aspects that are apparent to those of ordinary skill in the art, including aspects, which do not provide all of the features and advantages set forth, are also within the scope of this present disclosure. For example, the apparatuses, methods, and systems described may be performed digitally and differentially, among others. Accordingly, the scope of the present disclosure is intended to be defined only by reference to the appended claims.

What is claimed is:

1. An in-phase/quadrature (I/Q) clock generator, comprising:
 a poly-phase filter configured to generate a four-phase quadrature clock signal in response to a two-phase quadrature clock signal generated in response to a single-ended input clock signal;
a phase interpolator configured to generate an output four-phase quadrature clock signal from the four-phase quadrature clock signal; and
a poly-phase filter tune circuit coupled to an output of the phase interpolator and configured to generate a control voltage for the poly-phase filter to tune the four-phase quadrature clock signal from the poly-phase filter.

2. The I/Q clock generator of claim 1, further comprising:
a differential signal generator configured to generate the two-phase quadrature clock signal in response to the single-ended input clock signal received at the I/Q clock generator;
a duty-cycle correction (DCC) error stage coupled to the output of the phase interpolator and configured to detect a duty-cycle error of the output four-phase quadrature clock signal;
a digital calibration stage coupled to the DCC error stage and configured to generate a digital DCC tune value in response to the duty-cycle error; and
an input duty-cycle correction stage coupled to the poly-phase filter and the digital calibration stage, the input duty-cycle correction stage configured to pre-correct a duty-cycle of the two-phase quadrature clock signal according to the digital DCC tune value.

3. The I/Q clock generator of claim 1, in which the poly-phase filter comprises an analog/filter domain, comprising:
an input common mode logic buffer configured to convert the two-phase quadrature clock signal to an analog quadrature clock signal;
an input alternating current (AC) coupling stage coupled to an input of the poly-phase filter and configured to remove a direct current (DC) component from the analog quadrature clock signal;
an output AC coupling stage coupled to an output of the poly-phase filter and configured to add the DC component to the four-phase quadrature clock signal from the poly-phase filter; and
an output common mode logic buffer configured to convert and amplify the four-phase quadrature clock signal from the output AC coupling stage to a digital four-phase quadrature clock signal.

4. The I/Q clock generator of claim 1, in which the poly-phase filter receives a single frequency tone signal from an input AC coupling stage.

5. The I/Q clock generator of claim 1, further comprising:
an I/Q phase error detection stage coupled to the output of the phase interpolator and configured to detect a phase error of the output four-phase quadrature clock signal;
a digital calibration stage coupled to the I/Q phase error detection stage and configured to generate a phase tune value in response to the phase error; and
a current digital-to-analog converter (IDAC) coupled to the poly-phase filter tune circuit and the digital calibration stage, the IDAC configured to generate a PPF tuning current according to the phase tune value.

6. The I/Q clock generator of claim 5, further comprising:
a multiplexor having a first input coupled to the digital calibration stage to receive the phase tune value, a second input to receive a manual phase tune value, and an output coupled to the IDAC.

7. The I/Q clock generator of claim 5, in which the IDAC is configured to generate the PPF tuning current as a controllable current source according to the phase tune value and a first reference current.

8. The I/Q clock generator of claim 5, in which the poly-phase tune circuit comprises:
an operational amplifier having a first input coupled to the IDAC to receive the PPF tuning current and a second input to receive a second reference current and configured to generate the PPF tuning current; and
a replica transistor coupled to the IDAC and configured to receive the PPF tuning current to generate the control voltage at a gate of the replica transistor.

9. The I/Q clock generator of claim 1, further comprising a digital feedback loop.

10. A method for generating a four-phase quadrature clock signal, the method comprising:
generating a quadrature clock signal in response to a single-ended input clock signal;
generating, by a poly-phase filter (PPF), an analog version of the four-phase quadrature clock signal from the quadrature clock signal in response to a control voltage from a PPF tune circuit in a feedback loop;
generating, by a phase interpolator, a digital output four-phase quadrature clock signal from an amplified four-phase in-phase/quadrature (I/Q) clock; and
feeding back the digital output four-phase quadrature clock signal to the PPF tune circuit.

11. The method of claim 10, further comprising:
generating, by a differential signal generator, a two-phase quadrature clock signal in response to the single-ended input clock signal received at the I/Q clock generator;
detecting, by a duty-cycle correction (DCC) error stage coupled to the output of the phase interpolator, a duty-cycle error of the digital output four-phase quadrature clock signal;
generating, by a digital calibration stage coupled to the DCC error stage, a digital DCC tune value in response to the duty-cycle error; and
pre-correcting, by an input duty-cycle correction stage coupled to the poly-phase filter and the digital calibration stage, a duty-cycle of the two-phase quadrature clock signal according to the digital DCC tune value.

12. The method of claim 10, further comprising:
converting, by an input common mode logic buffer, a two-phase quadrature clock signal to an analog quadrature clock signal;
removing, by an input alternating current (AC) coupling stage coupled to an input of the poly-phase filter, a direct current (DC) component from the analog quadrature clock signal;
adding, by an output AC coupling stage coupled to an output of the poly-phase filter, the DC component to the four-phase quadrature clock signal from the poly-phase filter; and
converting and amplifying, by an output common mode logic buffer, the four-phase quadrature clock signal from the output AC coupling stage to the digital four-phase quadrature clock signal.

13. The method of claim 10, further comprising receiving, by the poly-phase filter, a single frequency tone signal from an input AC coupling stage.

14. The method of claim 10, further comprising:
detecting, by an I/Q phase error detection stage coupled to the output of the phase interpolator a phase error of the output four-phase quadrature clock signal;
generating, by a digital calibration stage coupled to the I/Q phase error detection stage, a phase tune value in response to the phase error; and
generating, by a current digital-to-analog converter (IDAC) coupled to a poly-phase filter tune circuit and the digital calibration stage, a PPF tuning current according to the phase tune value.

15. The method of claim 14, further comprising:
receiving, by a multiplexor at a first input coupled to the digital calibration stage, the phase tune value; and
receiving, by the multiplexor at a second input, a manual phase tune value.

16. The method of claim 14, further comprising generating, by the IDAC, the PPF tuning current as a controllable current source according to the phase tune value and a first reference current.

17. The method of claim 14, further comprising:
receiving, by an operational amplifier at a first input coupled to the IDAC, the PPF tuning current;
receiving, by the operational amplifier at a second input, a second reference current;
generating, by the operation amplifier, the PPF tuning current; and
receiving, by a replica transistor coupled to the IDAC, the PPF tuning current; and
generating, by the replica transistor, the control voltage at a gate of the replica transistor.

18. An in-phase/quadrature (I/Q) clock generator, comprising:
a poly-phase filter configured to generate a four-phase quadrature clock signal in response to a two-phase quadrature clock signal generated in response to a single-ended input clock signal;
a phase interpolator configured to generate an output four-phase quadrature clock signal from the four-phase quadrature clock signal; and
means for generating a control voltage for the poly-phase filter to tune the four-phase quadrature clock signal from the poly-phase filter.

19. The I/Q clock generator of claim 18, further comprising:
a differential signal generator configured to generate the two-phase quadrature clock signal in response to the single-ended input clock signal received at the I/Q clock generator;
a duty-cycle correction (DCC) error stage coupled to the output of the phase interpolator and configured to detect a duty-cycle error of the output four-phase quadrature clock signal;
a digital calibration stage coupled to the DCC error stage and configured to generate a digital DCC tune value in response to the duty-cycle error; and
an input duty-cycle correction stage coupled to the poly-phase filter and the digital calibration stage, the input duty-cycle correction stage configured to pre-correct a duty-cycle of the two-phase quadrature clock signal according to the digital DCC tune value.

20. The I/Q clock generator of claim 18, in which the poly-phase filter comprises an analog/filter domain, comprising:
an input common mode logic buffer configured to convert the two-phase quadrature clock signal to an analog quadrature clock signal;
an input alternating current (AC) coupling stage coupled to an input of the poly-phase filter and configured to remove a direct current (DC) component from the analog quadrature clock signal;
an output AC coupling stage coupled to an output of the poly-phase filter and configured to add the DC component to the four-phase quadrature clock signal from the poly-phase filter; and
an output common mode logic buffer configured to convert and amplify the four-phase quadrature clock signal from the output AC coupling stage to a digital four-phase quadrature clock signal.

* * * * *